(12) United States Patent
Boudreaux

(10) Patent No.: US 6,527,582 B1
(45) Date of Patent: Mar. 4, 2003

(54) CABLE BUNDLE CLAMP

(75) Inventor: Brent A Boudreaux, Highland Village, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/943,922

(22) Filed: Aug. 31, 2001

(51) Int. Cl.7 .............................................. H01R 13/58
(52) U.S. Cl. ..................................................... 439/449
(58) Field of Search ................................ 439/449, 450, 439/452, 459, 464, 894, 942

(56) References Cited

U.S. PATENT DOCUMENTS

| | | | | |
|---|---|---|---|---|
| 3,920,306 A | * | 11/1975 | Barnett, Jr. et al. | 439/459 |
| 4,984,982 A | * | 1/1991 | Brownlie et al. | 174/48 |
| 5,560,981 A | * | 10/1996 | Ito | 428/209 |
| 5,620,334 A | * | 4/1997 | Quillet et al. | 439/471 |
| 5,731,546 A | * | 3/1998 | Miles et al. | 174/135 |
| 6,045,394 A | * | 4/2000 | Matsuoka et al. | 439/464 |

* cited by examiner

Primary Examiner—Tulsidas Patel

(57) ABSTRACT

A cable bundle clamp to provides a tie-down for large cable bundles. The clamp includes a T-shaped element and a base. The T-shaped element rotates about a pivot point supported by the base. The cables of the cable bundle are split equally to pass on either side and underneath the T-shaped element. On one side of the T-shaped element, the cables of the bundle are "tie wrapped" together. The tie wrap pushes the T-shaped element when the bundle moves and prevents cable slippage past the T-shaped element due to movement of the connected electronic system. When pushed, the T-shaped element rotates and clamps down on the bundle to stop slippage therethrough. The clamp helps maintain a service loop distance for cabling attached to the electronics.

12 Claims, 4 Drawing Sheets

CABLE BUNDLE CLAMP

BACKGROUND OF THE INVENTION

1. Field of Invention

The invention pertains to the field of cable management systems including clamps, ties and other devices that are used to bundle electrical and optical cables. More specifically, the cable management systems facilitate handling and stress relief of discrete cables that are packaged as bundles.

2. Description of the Art

Complex electronic systems, including server architectures, typically have many terminals and connections for connected cabling. The cabling connects the systems to other electronics, power and communication devices. Often, the cabling is wrapped together in a single bundle of three to six inches in diameter.

Such a cable bundle is heavy and unwieldy. This is especially troublesome, for example, when the bundle connects to an electronic system in a rack. Access to the system is achieved by separating (partially or fully) the system from the rack, and the attached cabling must move with the system for this to occur.

To alleviate this problem, the prior art has attempted to tie the bundle to a particular location so as to create a "service loop" which is a length of cable bundle that moves to facilitate movement of the electronic system. Ideally, therefore, any movement of the system only requires movement of the service loop and not the whole cable bundle length. As a practical matter, however, the cable bundle is so thick and unwieldy that movement of the electronic system often causes slippage through the tie. Over time, the service loop disappears and the electronic system can not be fully extended from the rack because of restrictions of the shortened service loop.

There is, therefore, the need to provide a cable bundle tie that accommodates varying bundle sizes and that does not slip to maintain the service loop. One object of the invention is thus to provide a new and improved cable bundle clamp. Other objects of the invention are apparent within the description that follows.

SUMMARY OF THE INVENTION

In one aspect, the invention provides a cable bundle clamp to provide a tie-down for large cable bundles. The clamp includes a T-shaped element and a base. The T-shaped element rotates at a pivot point or pivot axis relative to the base. The cables of the cable bundle are divided approximately in equal number and pass on either side and underneath the T-shaped element. On the service loop side of the T-shaped element, the cables of the bundle are "tie wrapped" together. The tie wrap pushes the T-shaped element when the bundle moves. In absence of the tie-wrap, the bundle might slip past the T-shaped element due to movement of the connected electronic system. When pushed, the T-shaped element rotates and clamps down on the bundle to stop slippage therethrough.

The invention is next described further in connection with preferred embodiments, and it will become apparent that various additions, subtractions, and modifications can be made by those skilled in the art without departing from the scope of the invention.

BRIEF DESCRIPTION OF THE EMBODIMENTS

A more complete understanding of the invention may be obtained by reference to the drawings, in which.

DETAILED DESCRIPTION OF THE DRAWINGS

Figure 1:
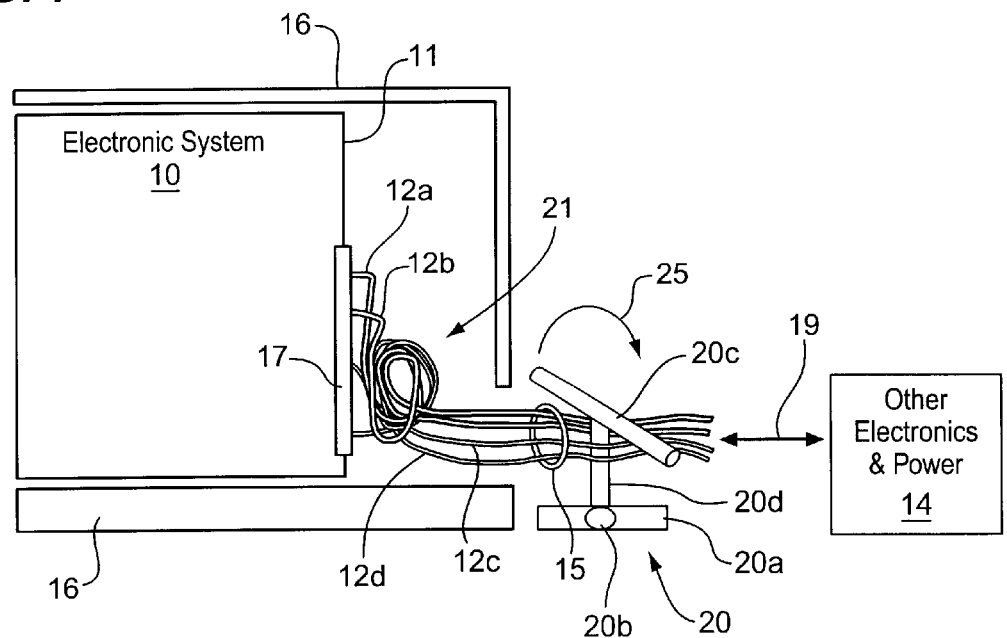
FIG. 1 illustrates a cable bundle clamp constructed according to the invention and shown in use with cabling coupled to an electronic system.

FIG. 1 shows a cable bundle clamp 20 constructed according to the invention. Clamp 20 facilitates management of multiple cables 12A, 12B, 12C, 12D between an electronic system 10 and other electronics and power module 14. For purposes of illustration, cables 12 are not shown connected to module 14. Four separate cables 12A, 12B, 12C, 12D are shown, though more or fewer cables may be included within the scope of the invention. Cables 12A, 12B, 12C, 12D are tied together with a tie wrap 15 to form a cable bundle, as shown.

In the typical application of the invention, system 10 is a computer or server and cables 12 connect to system 10 at a cable interface 17 to provide power and data to and from system 10, such as with electronics and power module 14. Clamp 20 functions to prevent slippage of cables 12 along direction 19 and between system 10 and electronics 14. Cables 12 are non-terminated with clamp 20.

Figure 1A:
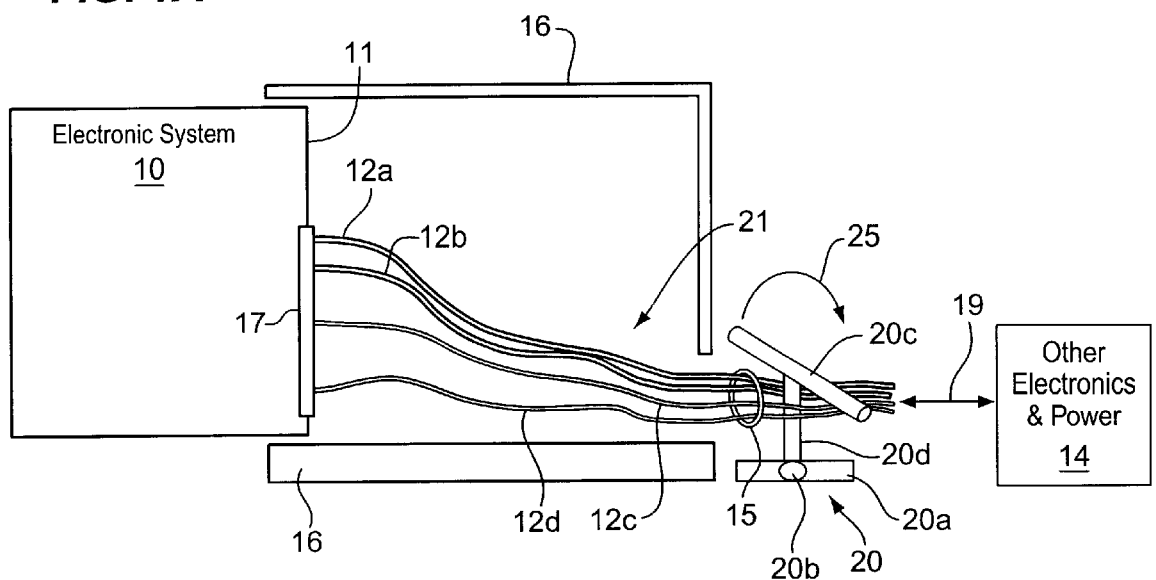
FIG. 1A shows the system of FIG. 1 extended from its rack in utilizing the service loop, in accord with the invention.

More particularly, system 10 typically resides within a rack or enclosure 16; accordingly, access to the back 11 of system 10 is obtained only by separation of system 10 from rack 16. The cable length between clamp 20 and interface 17 must therefore be slack enough to provide a "service loop" 21 that permits extension of system 10 from rack 16. FIG. 1A illustrates system 10 extended from rack 16 and utilizing the slack of service loop 21. When system 10 is pushed back within rack 16, cables 12 interact with clamp 20 to clamp the cable bundle so that the service loop is maintained. Clamp 20 grips cables 12 when clamp elements 20C, 20D rotate about a pivot point 20B in direction 25. Elements 20C, 20D preferably form a rigid and monolithic "T-bar" shape. Tie wrap 15 typically initiates the tilting of the T-bar formed by elements 20C, 20D, and thereafter T-bar 20C, 20D rotates along direction 25 to clamp down on the bundle of cables 12 to prevent slippage.

Figure 1B:
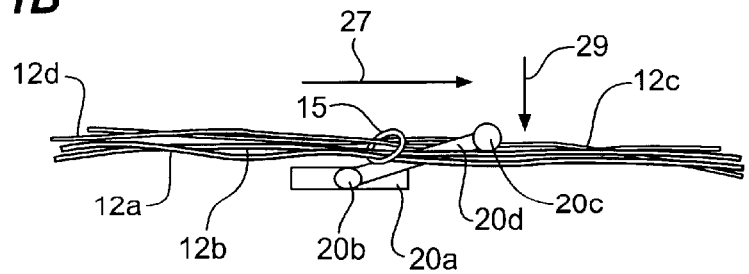
FIG. 1B shows the cable bundle clamp of FIG. 1 in a rotated position.

FIG. 1B illustrates clamp 20 in a rotated position clamping down on cabling 12A–12D, such as when system 10 of FIG. 1A is pushed back into rack 16. Specifically, in this operation, tie wrap 15 around cabling 12A–12D tends to push against T-bar 20C, 20D to initiate rotation about pivot point 20B; thereafter, T-bar 20C, 20D clamps down on cabling 12A–12D—as shown in FIG. 1B—to further grip cabling 12A–12D to prevent slippage by clamp 20. More particularly, in pushing back system 10 into rack 16, cable bundle 12A–12D tends to push clamp 20 in direction 27. Bundle tie wrap 15 butts up against stem element 20D and/or top bar element 20C, thereby pushing T-bar 20C, 20D downwards in direction 29. In the downward movement 29, T-bar 20C, 20D applies pressure on bundle 12A–12D to clamp cable bundle 20A–20D, preventing further slippage along direction 27. Beneficially, clamp 20 thereby accommodates its clamping function for differing cable bundle dimensions, up to and including the length of stem element 20D.

The use of tie-wrap 15 prevents slippage of cables 12A–12D past stem element 20D by binding cables 12A–12D forward of stem element 20D. Such slippage, absent tie-wrap 15, could push the cables 12A–12D rearwardly of stem element 20D and, consequently, consume the service loop 21 to prevent extension of the electronic system 10 relative to rack 16.

Clamp 20 typically includes a base element 20A to couple with other structures in holding clamp 20 in place; however element 20A is not required as clamp 20 may for example be coupled directly to a floor. Elements 20C, 20D may alternatively form a clamp "arm" that rotates and functions similar to the T-bar elements discussed above, and as a matter of design choice.

As shown, cables 12 are equally divided in number at the T-bar of elements 20C, 20D. Cables 12A, 12B are on one side of stem element 20D; cables 12C, 12D are on the other side of stem element 20D. All cables 12 are underneath top bar element 20C. Cables 12 may be divided in differing percentages about stem element 20D; though preferably cables 12 are divided into separate groups approximately equal in number on opposite sides of stem element 20D.

Figure 2:
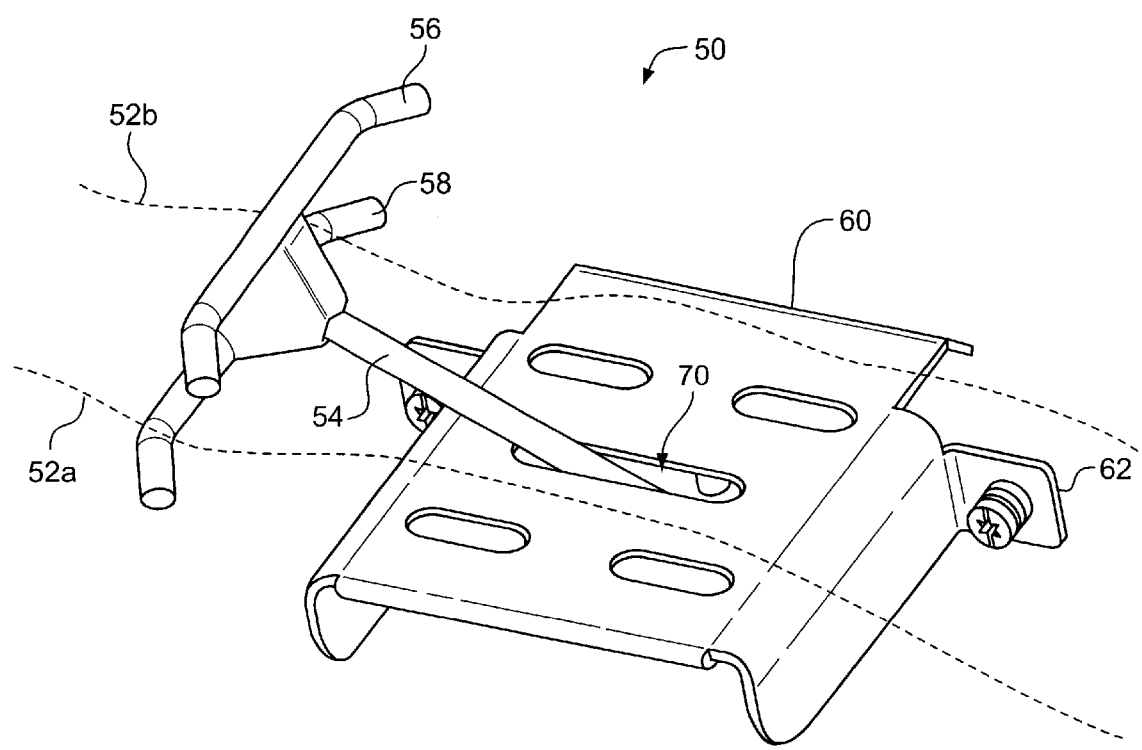
FIG. 2 shows a perspective view of one cable bundle clamp of the invention.
Figure 3:
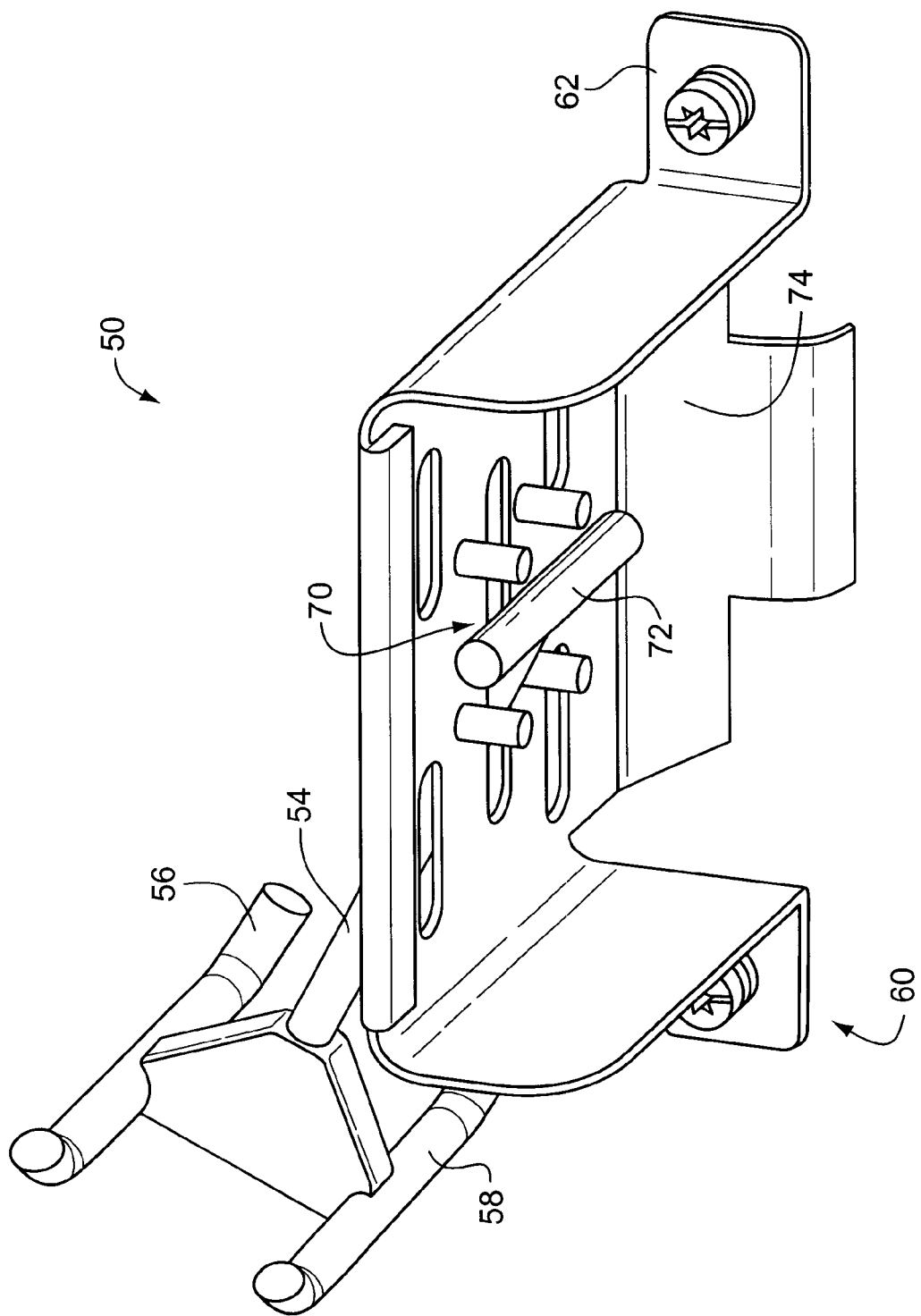
FIG. 3 shows a second perspective view of the clamp of FIG. 2.

FIG. 2 and FIG. 3 show two different perspective views of one cable bundle clamp 50 constructed according to the invention. Clamp 50 illustrates the preferred embodiment of the invention and functions like clamp 20, as shown in FIG. 1, to manage movement of a cable bundle 52 formed by cables 52A, 52B (shown only in FIG. 2). As above, the cable bundle 52 is split approximately in half with cable 52A on one side of stem element 54 and cable 52B on the other side, as shown. Stem element 54 and top bar elements 56, 58 form a rigid and monolithic T-bar shape. Cables 52A, 52B are preferably underneath top bar elements 56, 58. The T-bar rotates about a pivot axis 70 formed around rod 72, which is rigidly affixed to stem-element 54 so that axis 70 has a transverse orientation with respect to the axis of elongation in stem element 54. A journal flange 74 retains rod 72 beneath base 60 to facilitate pivoting motion of stem element 54 across arc 76. Base 60 may be attached to other structure such as through bolt attachment 62.

Figure 4:
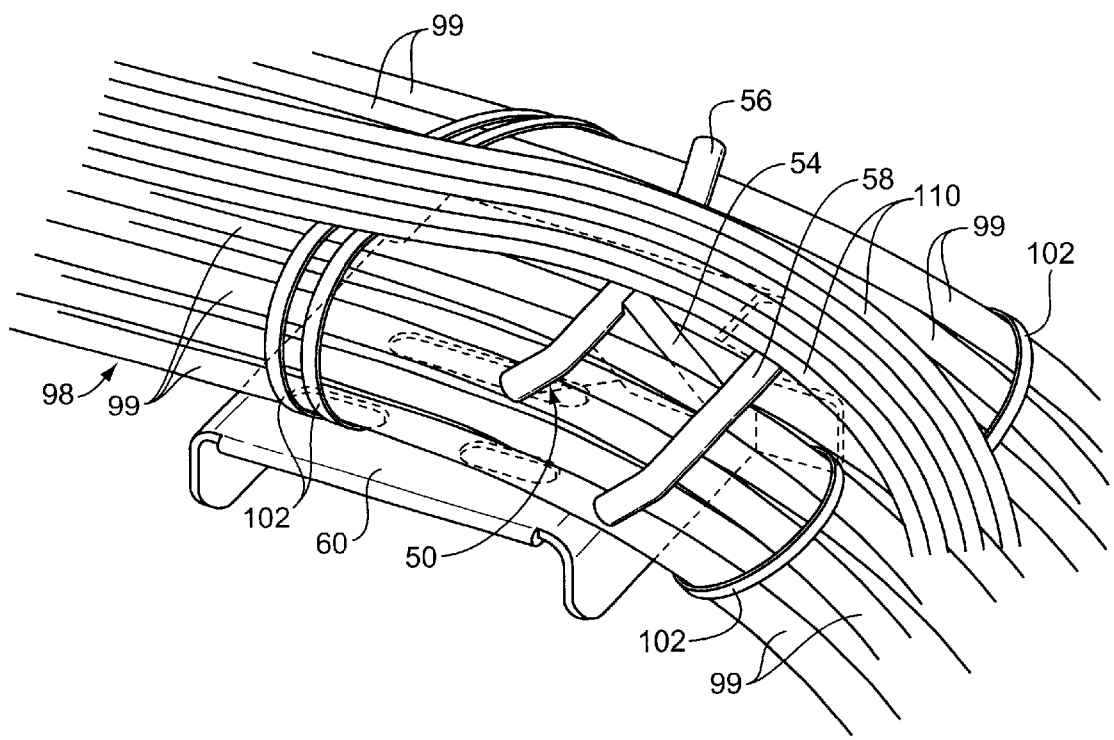
FIG. 4 shows the clamp of FIG. 2 and FIG. 3 in use with associated cabling.

FIG. 4 illustrates clamp 50 in operational use with several cables 99 within a cable bundle 98. A tie wrap 102, adjacent to top bar elements 56, 58, keeps cables 99 as a common bundle 98. Only about one half of bundle 98 is on one side of the stem element 54, as above. One advantage of clamp 50 is that other delicate cabling (e.g., fiber optics) 110 may rest on top of top bar elements 56, 58, as shown, so as not to be crushed under the clamping action; instead the delicate cabling may be simply tied to the larger bundle.

The invention thus attains the objects set forth above, among those apparent from the preceding description. Since certain changes may be made in the above methods and systems without departing from the scope of the invention, it is intended that all matter contained in the above description or shown in the accompanying drawing be interpreted as illustrative and not in a limiting sense. It is also to be understood that the following claims are to cover all generic and specific features of the invention described herein, and all statements of the scope of the invention which, as a matter of language, might be said to fall there between.

Having described the invention, what is claimed is:

1. A clamp for securing a bundle of cables relative to an electronics system, comprising:

a T-shaped element having a stem element and a first top bar element, the cables being non-terminated with the clamp, divided around the stem element and underneath the first top bar element; and pivotable mounting structure configured for facilitating rotation of the T-shaped element about a pivot axis to clamp down on the cable bundle in response to shifting movement of the cable bundle.

2. The clamp of claim 1, further comprising at least one tie wrap for tying the cables together to form the bundle, the tie wrap being located adjacent to the T-shaped element and between the T-shaped element and the electronics system, the tie wrap facilitating rotation of the T-shaped element by pushing the T-shaped element during the shifting movement of the bundle.

3. The clamp of claim 1, further comprising a second top bar element, the stem element, the first top bar element and the second top bar element forming a monolithic rigid T-shaped element.

4. The clamp of claim 1, wherein the pivotable mounting structure comprises a base element for attaching the clamp to other structures, the base element defining the pivot axis through use of a journal flange supporting the T-shaped element.

5. A system for maintaining cable service loop distance for cabling coupled to electronics, comprising:

at least two cables coupled to the electronics;

a clamp having an arm that is rotatable about a fixed axis separated from the electronics by a distance associated with the service loop distance, the cables being divided around the clamp; and a tie wrap for tying the cables together in a common bundle, the tie wrap being adjacent to the clamp and between the clamp and the electronics.

6. The system of claim 5, wherein the arm comprises a stem element, the cables being divided around the stem element.

7. The system of claim 6, wherein the arm comprises at least one top bar element rigidly affixed to the stem element, the cables being between the top bar element and the fixed axis.

8. The system of claim 7, wherein the top bar element and the stem element form a T-shaped element.

9. The system of claim 5, the clamp comprising a base element affixed to a structure other than the electronics, the arm rotatable about the fixed axis and connected to the base element.

10. A method for securing cables to electronics to maintain a service loop distance for the cables, comprising the steps of:

dividing the cables around a clamp arm rotatable about a fixed axis that is removed from the electronics by a separation distance associated with the service loop distance;

tying the cables together as a common bundle between the electronics and the clamp arm; and shifting the common bundle with associated rotation of the clamp arm to clamp down on the bundle.

11. A method of claim 10, wherein the step of dividing the cables comprises splitting the cables approximately evenly about the clamp arm.

12. A method of claim 10, wherein the step of dividing the cables comprises splitting the cables around a stem element and underneath a top bar element, the stem element and top bar element forming a T-bar shape rotating as the clamp arm.

* * * * *